United States Patent [19]

Maggi et al.

[11] Patent Number: 4,554,636
[45] Date of Patent: Nov. 19, 1985

[54] APPARATUS FOR TESTING CIRCUITS WITHIN A SYSTEM

[75] Inventors: Joseph A. Maggi; Barry F. Wilensky, both of Brooklyn, N.Y.

[73] Assignee: Allied Corporation, Morris Township, Morris County, N.J.

[21] Appl. No.: 429,599

[22] Filed: Sep. 30, 1982

[51] Int. Cl.[4] .......................................... G01R 31/00
[52] U.S. Cl. .............................. 364/481; 324/73 AT; 364/489
[58] Field of Search ............... 364/481, 482, 488, 489, 364/490, 491; 371/22, 29; 324/73 AT; 340/720, 799; 370/97; 358/10, 280, 284

[56] References Cited

U.S. PATENT DOCUMENTS

| 3,651,315 | 3/1972 | Collins | 364/489 |
| 4,135,209 | 1/1979 | Logan | 358/10 |
| 4,270,178 | 5/1981 | Lillig | 364/481 |
| 4,466,014 | 8/1984 | Wilensky et al. | 358/10 |

Primary Examiner—Gary Chin
Assistant Examiner—Heather R. Herndon
Attorney, Agent, or Firm—Stanley N. Protigal; Howard G. Massung

[57] ABSTRACT

A capability for internal self-testing is provided for a test instrument in which data, in digital and in analog form, is sampled from various test points. A programmable delay generator is used to process some of the data and to provide strobes which control the data output and which control the sampling of data. This enables measurements to be made at a preselected time after the occurrence of a particular signal, thereby giving the system a capability of using the delay generator not only for providing comparisons of time functions but also for initiating test sub-routines.

The self-test capability enables test equipment having time-dependent functions, such as test equipment for video displays, to be verified with respect to accuracy in order to establish a confidence test.

18 Claims, 6 Drawing Figures

APPARATUS FOR TESTING CIRCUITS WITHIN A SYSTEM

Cathode ray tube (CRT) type displays are becoming the primary man-machine interface used in, for example, avionic display systems. Testing in the maintenance environment has been costly, complex, and time consuming. Direct View (i.e., Heads-Down) and Heads-Up CRT displays are used in navigation, flight control, and weapons management systems. These displays are being used increasingly to replace and augment the multitude of electromechanical displays, instruments, gauges, and dials that comprise many of today's aircraft instrument panels. As this trend continues, with the attendant improvements in data processing and computer assistance, the pilot and aircrew will become systems managers. This relieves them of many routine monitoring tasks and permits them to devote more time to the critical tasks which are suitably presented on the CRT displays. There are additional benefits such as hardware simplification, commonality, and improved reliability and maintainability. With the increased usage of these devices, there is a growing need for more reliable, faster, and complete testing.

Direct-view CRT displays (Heads-Down Displays) are television-type instruments which are situated in both aircraft control panels (below the windscreen) as well as located in rear cabins. This type of display produces a diffused, non-collimated light image which can be described in rectilinear coordinates (i.e., horizontal and vertical). These displays process sensory information derived from a variety of sources. These include radar, TV cameras, infrared detection systems, and electronically generated graphic and alphanumeric aircraft status information. The resulting display may be presented as a raster scan, random scan (i.e., stroke), or a combination of both.

To evaluate the capability of these displays to adequately reproduce the images derived from the above sensory sources and to determine the cause of any problems, it is necessary to test at least the following parameters:

Photo-optical Response
  Brightness
    Area in raster mode
    Line in stroke mode
  Contrast
    Shades of gray in raster mode
    Relative to reflected ambient in stroke mode
  Color
    Hue (photometric frequency response) and saturation for raster and stroke modes.
    Four colors (red, yellow, orange, and green) for beam penetration CRTs.
    Eight or more colors for shadow-mask CRTs.
  Resolution
    In Raster Mode
    Horizontal resolution (in direction of scanning lines) includes video channel and CRT characteristics (TV lines or line pairs)
    Vertical resolution (perpendicular to scanning lines) includes line width and spacing (number of lines per height)
    In Stroke Mode Line width measurement
  Orthogonality and center
  Linearity—total and differential linearity for raster and stroke mode
  Character—fidelity in stroke mode
  Registration—overlap of symbol position in mixed stroke and raster display mode
Electronic Circuitry Response
  Sync and video separation—in composite video mode
  Amplitudes
    Video in raster and stroke modes
    Deflection in stroke mode and in separated H/V raster mode
  Writing rates—in stroke mode
  Scan conformity—in raster mode
  Slew and settling times—in raster and stroke modes
  Bandwidth
    Video channel in raster mode
    Deflection channel in stroke mode The Heads-Up Display (HUD) is an electro-optical device for combining an electronically generated image with the real-world scene. The HUD is located in such a way that the image is projected in a collimated fashion to produce images that are focused at infinity. The overlaying of images with real-world scenes is necessary to perform target detection, identification, tracking, and landing guidance, thus increasing the importance of positional placement accuracy. Due to the nature of collumated images, the information displayed is characterized in angular coordinates (i.e., azimuth and elevation). These type displays also process similar sensor data as previously discussed. Earlier HUD displays mainly utilized a stroke type symbology format. Avionic display systems currently in development combine existing stroke formats with raster scan formats and are capable of operating in stroke mode alone or raster mode combined with overlayed stroke symbology.

The evaluation of these displays to adequately reproduce the input sensory information requires testing all of the parameters previously described with the differences of:

Contrast—relative to real-world images
Positional measurements—elevation and azimuth angles It has been customary to separate the display functions and image generation electronics in the avionics into two black boxes. This is usually due to the space requirements in the cockpit and because, in some cases, one electronics box may be used to generate signals to more than one remotely located CRT display.

To satisfy the testing requirements for a vast majority of present and future avionic displays, a choice of programmable electronic waveforms and CRT test patterns with programmable parameters must be made available. The patterns that should be chosen should not only verify CRT quality, but should be useful in verifying and fault-isolating the display unit's electronics.

FIG. 1 shows a typical set of test patterns. Each of the patterns is useful for testing raster displays, whereas patterns d-f and h-j are also quite useful for testing stroke-scanned displays. Each of the displays in FIG. 1 should have programmable features which, at the very least, includes programmable color and/or intensity. These tests are used as follows:

| Parameters To Be Verified | Applicable Test Patterns |
| --- | --- |
| Brightness | g, i, b |
| Contrast Ratios | a, f |
| Black Level | b, a, g |
| Low Frequency Response | b |
| Mid Frequency Response | b, j |
| Interlace (Line Pairing) | c |
| Centering Orthogonality | d |

-continued

| Parameters To Be Verified | Applicable Test Patterns |
|---|---|
| Size | d, b |
| Linearity | e, f |
| Horizontal Resolution and Modulation Transfer Function | k, l |
| Vertical Resolution | h, g |
| Spot Size | h, g, f |
| Color | a, b, c |
| Gray Scale & Gamma Correction | a, c |
| Focus | k, f, h, j, i |
| Stroke Character Fidelity | n |
| Deflection Small Signal Band Width | |
| Deflection Transient Response and Video | |
| Deflection Timing | |
| Writing Speed Brightness | |
| Positional Accuracy | |
| Stroke Resolution | |
| Position Registration | n |
| Position Overlay Between Raster and Stroke | |
| Geometric Aberrations, Parallax and Cross Talk | h, j |

Note that, despite the complexity, each test pattern has a certain degree of repeatability, not only by the definition of, "pattern", but also as interpreted when constructing the display of the pattern.

In addition to the number of different patterns, these raster patterns are generated in a number of formats. These formats range in vertical resolution from less than 240 lines per frame (non-interlaced) to greater than 1,029 lines per frame (interlaced) and in horizontal resolutions from less than 240 TV lines to greater than 1,000 TV lines per picture height. Standard raster formats are defined by EIA standards RS-170 and -412A, NATO STANAG 3350, NTSC, and the European standards (SECAM and numerous PAL variations). These standards differ not only in horizontal and vertical resolutions, but in sync, blanking, equalizing, and serration timing, and differ in sync and video amplitudes. In the military, the waveforms are usually modified versions of the standards, with differences in vertical blanking time, equalizing and serration formats, and waveform amplitudes.

Communication to the display unit may be in composite video format, thus requiring the programmable generation of all the composite video waveform parameters in a combined single complex waveform. For the sync separated format, the same programmability is necessary while transmitting video (with blanking) and sync signals over individual transmission lines in proper time-phase synchronization. The separate deflection and video format still requires the internal generation of all the timing parameters, but with the addition of the transmission of separate horizontal and vertical deflection waveforms. These deflection signals can be in either the usual sawtooth (TV sweep) waveform, the triangular B-scan, the PPI arc-scan (sinusoidal), or a variety of other formats. In each of these, the amplitudes of the deflection waveform must be programmable.

For stroke generation, the pertinent parameters that must be programmable are:
Vectors and arcs
  starting positions
  terminating position or length and angle
  radius and direction (arcs only)
  writing speeds
  intensity and color
Special symbols
  starting position
  symbol content
  symbol orientation (angular)
  writing speeds
  intensity and color Based upon analysis of HUD's used on current military aircraft, symbol positional accuracy at the center of the screen is fairly high. For direct view, the usual screen width ranges from 4 to 8 inches with narrow line widths. This requires stimulus with a high resolution. Based upon obtaining the minimum required brightness in cockpit environments and the amount of symbology presented for current and proposed aircraft, writing speeds for HUD's can vary considerably. For direct view displays, the linear writing speeds are significantly faster.

To express a raster waveform with sufficient resolution to address only 400 TV line horizontal resolution would require 210,000 data points for a 525-line raster, and over a million points for 1,000-line rasters with 1,000 TV line resolution. For color, these figures would increase by a factor of at least 3 ($2^3$ colors). Algorithms can be devised to calculate the points for repeating raster patterns and thereby considerably reduce the number of points specified, depending on the pattern. Nevertheless, this would create a situation that still requires a programmer to define a large number of points and would also need additional memory to store the values. Also, if the test requirement document (TRD) has been conveniently written in optical measurement terms, the programmer would be required to understand the complex relationship between signals and patterns.

One technique that might be considered to obtain the various electronic waveform stimuli would be to optically scan a set of suitable test pattern targets with a TV vidicon camera or similar device. The camera output would then be scan-converted to the desired format. The accuracies and stability that could be achieved would be limited by the camera and associated data conversion electronics. Furthermore, in order to scan-convert to different formats and at different scan rates, electronic circuitry must provide the necessary programmable scan-conversion timing signals. Since programmable electronics must be provided, it is more fruitful to include programmable electronic test pattern generation and thus avoid the scanner, target, and mechanical accuracy limitations. In addition, electronic implementation provides flexible pattern generation through software, reduced system size, and increased reliability.

A more general method of testing display systems, including both raster and stroke, has been made available by the development of a programmable display test unit. This unit is capable of providing synchronized video waveforms compatible with EIA standards as well as non-standard formats within the EIA stated ranges. The raster patterns produced are limited to horizontal lines, vertical lines, cross-hatch, resolution, and gray scales. Character symbology is only generated in stroke mode and contains a fixed repertoire of characters.

The basic technique of waveform generation for the raster mode is video activation at the appropriate synchronized time using registers set for a particular vertical line (or a set of particular vertical lines) and for a particular horizontal line (or a set of particular horizontal lines). Character generation is performed through a symbol formatting memory containing 256 character locations and a separate symbol memory with a limited number of character shapes. The symbol memory contains digital information for a fixed number of strokes for each character, which is converted to analog form by video drive circuits. These signals, together with position information, allows the fixed symbol repertoire to be placed over the entire screen with 10-bit resolution. Furthermore, stroke and raster are multiplexed in real time to provide mixed mode.

This system uses an adapted video test procedure which approaches the machine-independent and user-oriented test language. However, since the language contains several fixed selectable parameters that are characteristic of the hardware limitations, the goal of a video test procedure has not been completely met. Examination of the raster display source statements for raster test patterns reveals a finite or fixed range of discrete values for horizontal resolution that may be programmed. They range from 140 to 840 vertical line pairs. In addition, the programmability of the gray scale can only assume values of 8, 10, or 11 shades. The proposed language statements for test pattern selection is limited to a fixed set which does not allow for synthesizing and varying other raster patterns. In the stroke statements, the variables used to identify characters, special symbols, and stroke patterns are uniquely coded. While this seems to be a suitable approach, it requires a library of particular symbols and patterns. This approach would cause a proliferation of library content. The best way to circumvent this problem would be to allow the generation of arbitrary strokes (vectors and arcs).

Although this approach provides a flexible choice of synchronization parameters, it limits the test patterns and characters that may be produced. New test conditions and situations may not be accommodated without some change in both hardware and/or software.

It is accordingly an object of the invention to provide a confidence test for use with test equipment having time-dependent functions. It is a further object to provide a built in test capability for test equipment in which the time-dependent functions are measured by programmable means and in which the programmable means also provides a strobe for initiating test sub-routines. It is a further object of the invention to provide built in test equipment (B.I.T.E.) for furnishing data from analog and digital signals which are obtained from a plurality of test points. It is a further object of the invention to provide built in test equipment for a video testing apparatus, in which the apparatus itself generates test patterns in a variety of programmable formats.

SUMMARY OF THE INVENTION

In accomplishing these objects, a capability of self-testing video display equipment is established by selecting data from a plurality of test points and providing the data to a plurality of test point multiplexers. The test point multiplexers provide analog and digital outputs to an analog and a digital multiplexer, as appropriate. The digital multiplexer provides signal information to a programmable delay generator which controls information received from the analog multiplexer. The programmable delay generator also provides timing information and provides an output strobe to control the gathering of information within the test equipment. The equalized output from the analog multiplexer is also compared with a reference value to establish a digital pulse train which, in turn, is provided to the digital multiplexer. The self-test capability establishes a confidence test and increases the reliability of data obtained when the test equipment is testing an external unit under test (U.U.T.).

DETAILED DESCRIPTION OF THE PREFERRED EMBODIMENT

Figure 1:
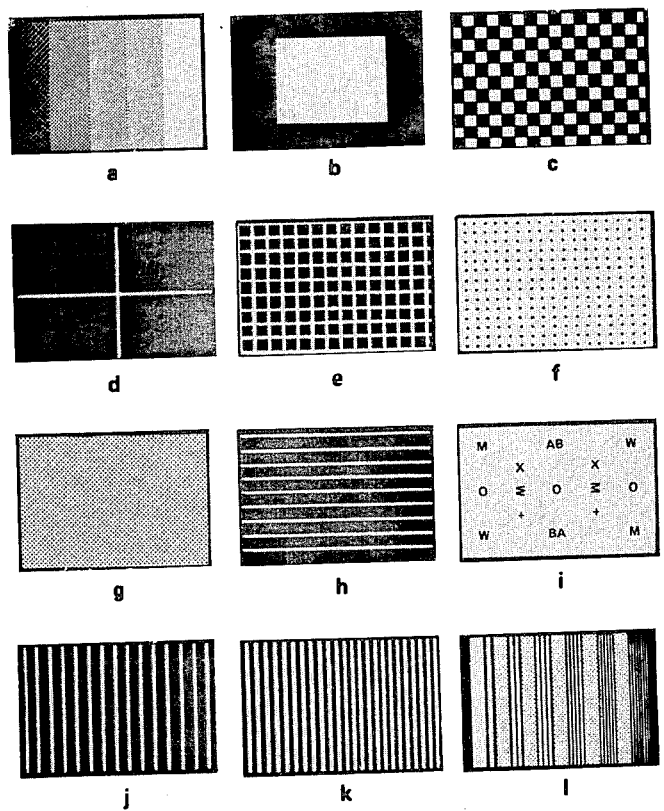
FIG. 1 shows representations of video test pattern displays.
Figure 2:
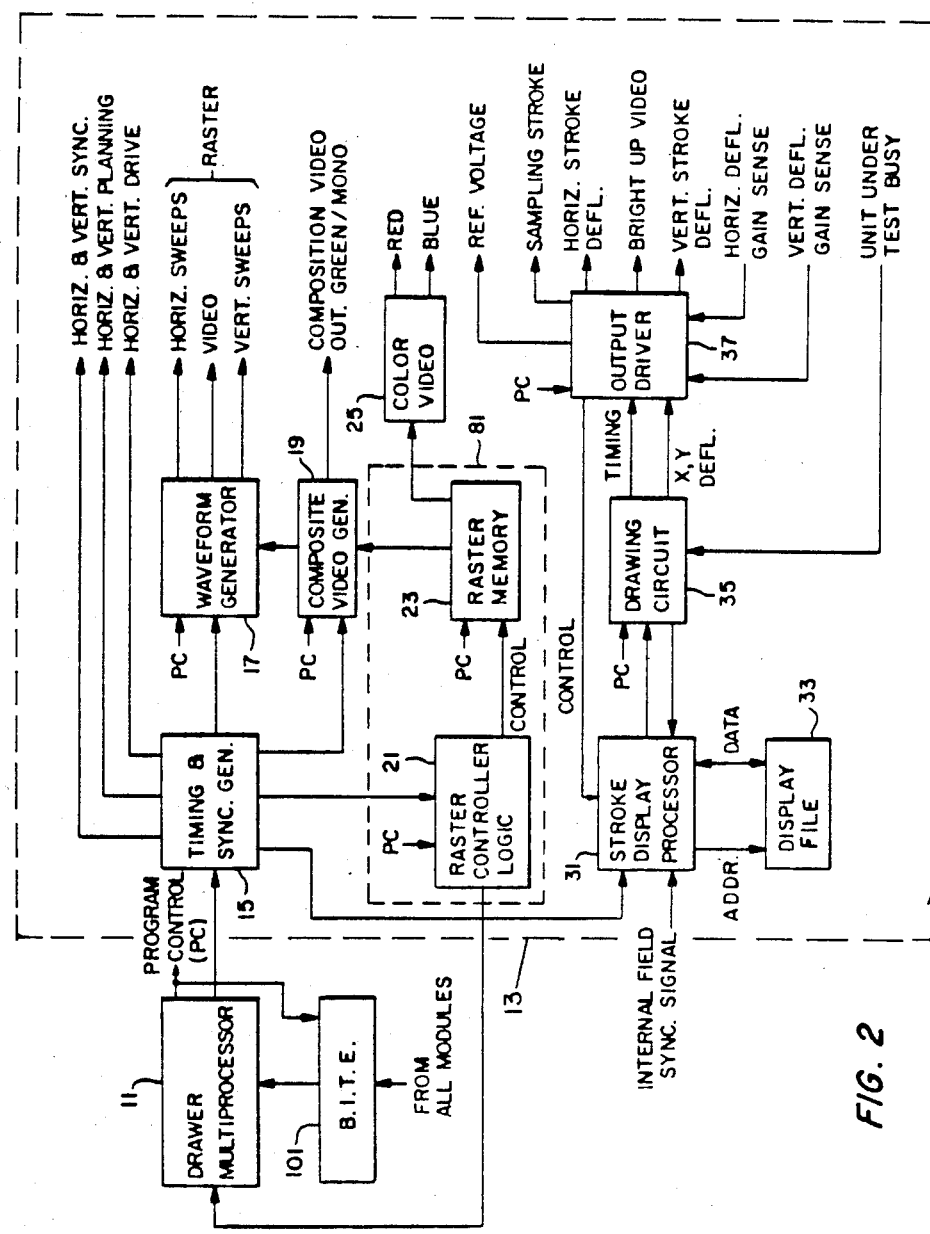
FIG. 2 is a block diagram showing a video display generator used with the invention.

As indicated, the system according to the invention is intended to generate display patterns such as is shown on FIG. 1, as well as other patterns which are not shown, partly because the system is designed such that the patterns are programmed into memory as software and consequently would not necessarily exist prior to that time. As indicated in FIG. 2, these displays are provided through a multi-processor 11 to a video display generator 13. The video display generator includes a timing and sync generator 15 which provides timing signals which enable a CRT scanning system to function. These signals include time references for horizontal and vertical sync, blanking and drive. The timing and sync generator also provides a dependent reference signal to a waveform generator 17. The waveform generator 17 controls the raster output by controlling horizontal and vertical sweeps, as well as a video output signal. The dependent reference signal occurs at approximately a predetermined frequency that is established as a multiple of a horizontal line period, as will be described later. The timing and sync generator also provides timing signals through a video generator 19 and a color raster circuit which includes a raster control and logic module 21, a raster memory 23 and a color video output circuit 25. In most systems using separate color circuits, one color (usually green) is included in the output of the video generation section. Therefore, the composite video generator 19 is also part of the color raster circuit. In various color display systems, the composite video generator 19 and/or the color video output module 25 will provide all of the color information.

A non-raster scanning capability is provided by a stroke display processor 31 which receives a timing signal from the timing and sync generator 15 and addresses a display file 33 in order to obtain a specific display. The stroke display processor 31 provides a signal to a drawing circuit 35 which in turn provides X and Y deflection timing signals to an output driver 37.

Figure 3:
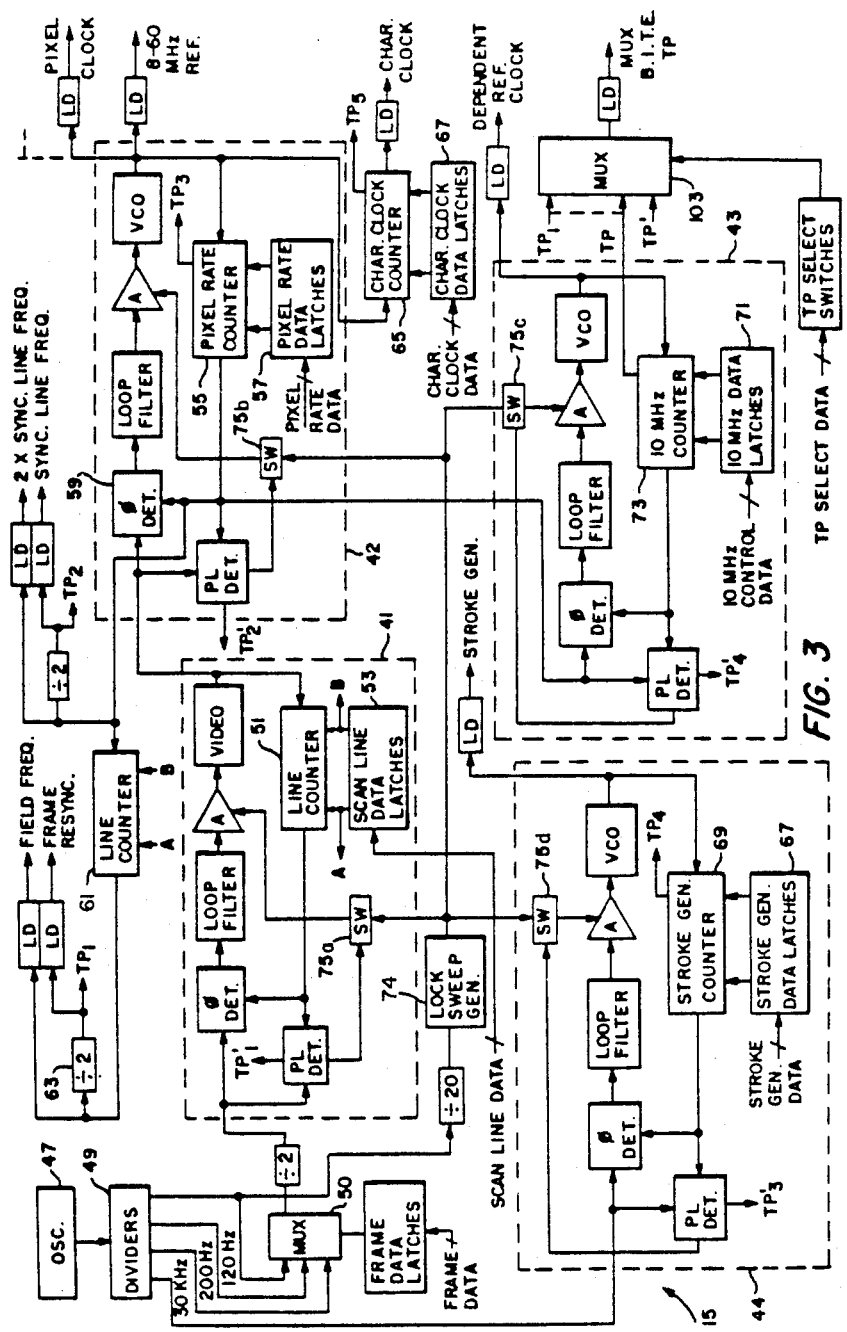
FIG. 3 is a block diagram showing a timing and synchronous generator used in a video display generator of FIG. 2.

Referring to FIG. 3, the timing and sync timing generator 15 uses a plurality of phase locked loops (PLL's) 41–44 to produce signals at desired oscillations in ratios which can be programmed so as to change the scanning pattern to be used. An oscillator 47, which in the prototype design is a 6 MHz oscillator, provides a reference signal to a divider network 49 which provides a plurality of output frequencies. A series of frequencies representing different field rates is fed from the divider network 49 to a frequency selection multiplexer 50 which is used to control which field is used.

Phase locked loop 41 is a scan line PLL and is used to provide an oscillation signal at the rate of line scanning. This is accomplished by providing a line counter 51 in the feedback section of PLL 41. Line counter 51 is controlled in accordance with scan line data by scan line data latches 53. The signal synthesized by the scan line PLL 41 is provided to phase locked loop 42 which is a pixel frequency generator. The pixel frequency generator 42 multiplies the frequency output of PLL 41 in accordance with a selected number of pixels per line. A pixel counter 55 is controlled by pixel data latches 57 and controls the output frequency of the pixel frequency generator 42 as a multiple of the output frequency of PLL 41. The count signal provided from the pixel counter 55 to a pixel phase detector 59 occurs at the same frequency as that of the output phase locked loop 41 and occurs as a periodic pulse. This signal is provided to a lne counter 61 which is controlled by the scan line data latches 53 in order to provide an output at a field frequency rate. A frame frequency divider 63 provides an output at a frame rate which typically has a frequency of ½ the field frequency rate.

The pixel frequency generator provides a pixel clock output and a reference output at the pixel frequency which is typically in the range of 8 to 60 MHz. The pixel frequency generator also provides an output which is divided by a character clock counter 65 which is controlled by a character clock data latches 67.

Phase locked loop 43 is a dependent reference frequency generator and generates a reference frequency which is nominally fixed to a given value such as 10 MHz. This provides a reference frequency for controlling the video signal as the scan processes across the raster. For this reason, it is advantageous that the frequency from PLL 43 be a multiple of the scan line frequency. This causes a signal to retain a constant phase angle at the initiation of each scanned line, thereby elimination waviness. In order to accomplish the necessary synchronization with the initiation of scan lines, a signal representative of the scan line frequency is derived from PLL 42 and is therefore representative of the timing of one of the pixels on each scanned line. The dependent reference frequency therefore is a precise integral multiple of the scan line frequency. Therefore, the dependent reference frequency is permitted to be offset from the nominally fixed frequency value in order to become an integral multiple of the scan line frequency. While 10 MHz is suggested as the nominal frequency, it is also possible to provide for a dependent reference frequency at different rates such as 20 MHz or more by mere programming. High frequencies increase resolution but entail greater hardware costs due to the high frequency. The dependent reference frequency controls periodic functions such as horizontal and vertical sync and blanking.

Phase locked loops 41, 42 and 43 are intended primarily for controlling the raster scan function of the testing equipment being described. If a display, such as a heads up display (HUD), utilizing a stroke scanning system is being tested, a stroke frequency is generated by phase locked loop 44. The dependent reference frequency may be generated from the dependent reference frequency generator 43 even though such a frequency signal sould not necessarily be locked into phase with the stroke frequency signal produced by phase locked loop 44. The frequency output of phased locked loop 44 is controlled by stroke data latches 67 through a stroke counter 69.

Because of the use of counters 51, 55 and 69, the number of lines and pixels displayed and the stroke output of the apparatus is able to be incrementally varied by merely controlling the data latches 53, 57 and 67. Additionally, the dependent reference frequency generator 43 is also provided with a data latch 71 controlling a counter 73. This enables the dependent frequency to be maintained at the desired nominal value and, if desired, to be changed within limits established by the capabilities of the hardware of the system. Typically, the dependent reference frequency generator 43 will provide a dependent reference frequency output that deviates from the nominal frequency by less than 1%, and more likely by less than 0.5%.

In order to enhance the stability of timing and sync generator 15, means are provided to bring the phase locked loops 41–44 to lock onto appropriate frequencies. In the preferred embodiment, this is accomplished by a lock sweep generator 74 which transmits sweep signals to each of the phase locked loops 41–44 through switches 75 in a manner known to those skilled in the art. Conveniently, the lock sweep generator 74 derives its sweep signal from oscillator 47. Alternatively, each phase locked loop may have its own sweeping circuit or its own broad frequency stabilization circuit (not shown).

Referring to FIG. 2, the video display generator 13 receives, from the multiprocessor 11, commands which include a representation of an image to be displayed. In the preferred application, the video image is that of one of the test patterns shown in FIG. 1. The patterns are programmable as described below with reference to FIG. 5, and are consequently not fixed in quantity and may be modified in accordance with a specific use of the test system.

Figure 4:
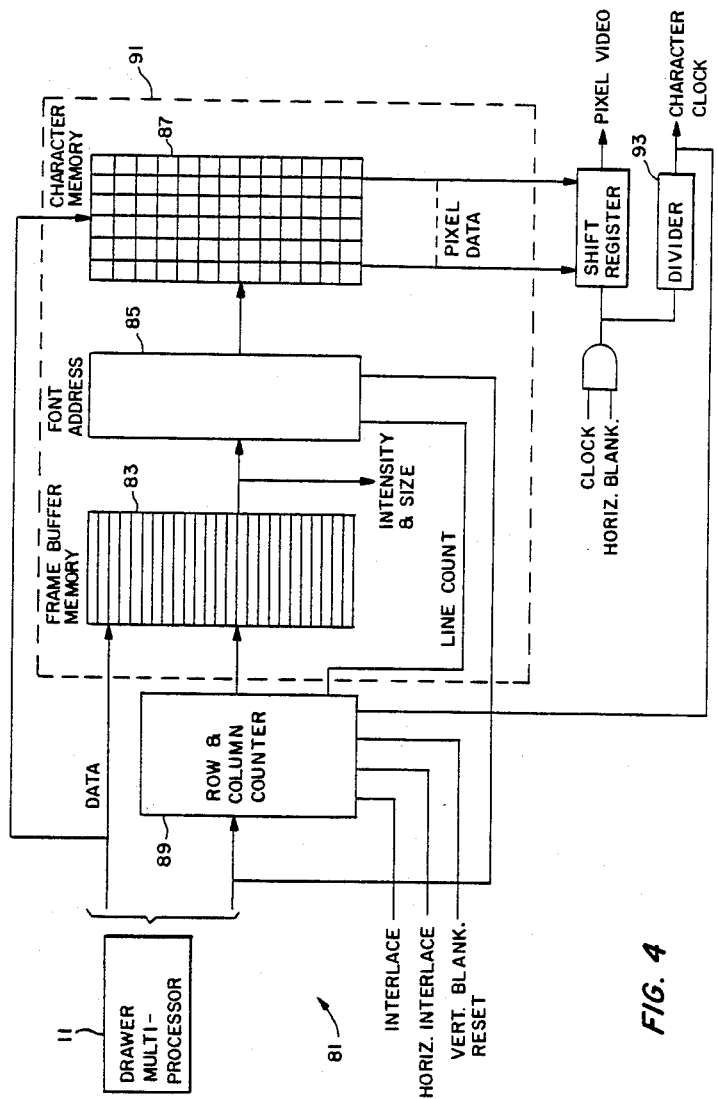
FIG. 4 is a block diagram of a memory control circuit used for generating characters to be displayed through the video display generator of FIG. 2.

Referring to FIG. 4, a pattern memory and control circuit 81 includes a frame buffer memory 83, a font address circuit 85 and a character memory 87. The frame buffer memory 83 is divided into segments which provide an indication of a portion of a composite video image each portion represents. The character memory 87 is divided into specific character blocks, with each character block representing a portion of a test pattern. The font address circuit 85 is a memory address circuit which addresses the character memory 87 and provides data from the frame buffer memory 83 to the character memory 87 in order to associate each portion of the frame buffer 83 with a character in the character memory 87. A programmable row and column counter 89 determines which section of the frame buffer memory 83 is being addressed by the multiprocessor 11 and in which section of the frame buffer memory 83 is addressing the character memory 87. The frame buffer memory 83, the character memory 87 and the font address circuit 85 are mounted on a memory circuit card 91. The system obtains information concerning a constructed image by the programmable row and column counter 89 addressing the memory circuit card 91 in accordance with the scan pattern of the display system.

Figure 5:
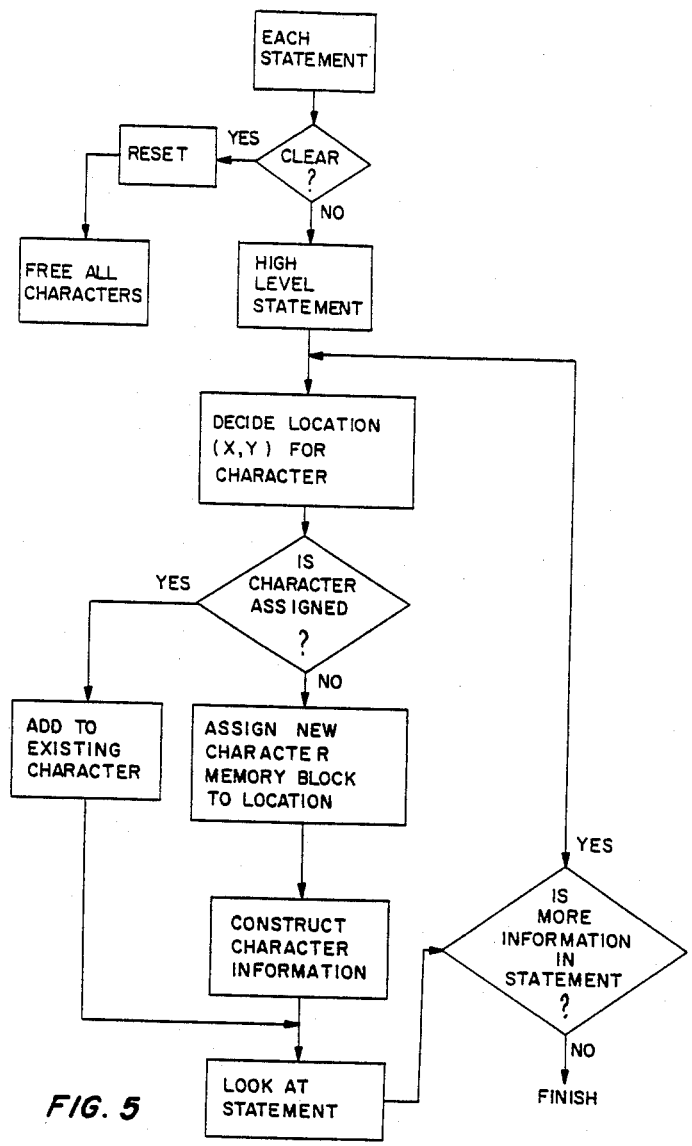
FIG. 5 is a flow chart showing the character generation technique used to generate characters to be displayed by the video display generator according to the invention.

Referring to FIG. 5, the patterns are constructed by constructing a plurality of characters from a high level statement. After issuing a statement, an x, y location for a first character is chosen. The microprocessor then determines whether a character in the character memory meets the requirements of the high level statement for the x, y location. If no character exists in memory to meet the requirements, then a character which meets part of the requirements and which is not already assigned to another location is searched for. Of course, in the first location chosen, no such character will exist; however, in subsequent steps, it is likely that some of the same characters will repeat themselves. If no character can be found, then a "blank" character is chosen from memory; that is, a blank space in the character memory 87 is chosen and is assigned to the first location. The address of the assigned character is put into the frame buffer memory 83 and is assigned a color, an intensity and a size.

The character is then constructed by providing information from the high level statement concerning the character content, such as the height and width of the character. In the case of complex information, an anding of patterns is applied in order to supply additional information to the character stored. After one character construction step, a microprocessor looks at the high level statement to determine whether there is more information in the statement to be assigned to characters. If more information remains in the statement, the multiprocessor returns to the step of deciding a location for the character, thus initiating a repeat of the process. When no more information is in the statement, the pattern is considered to be constructed. Because of the repetition of characters in patterns, it is necessary to only provide a small amount of characters in memory.

In the preferred embodiment, the characters may have a width of from 4 to 16 spaces, as determined by divider 93; thus providing an appropriate number of characters to be displayed, particularly given the repeat features of most test patterns. The character width is variable and therefore divider 93 should be a variable divider. Likewise, the character memory 87 is expected to store varying size characters which typically range, in width and in height, from 4 to 16 pixels. This gives the program a capability of displaying 1 pixel width features in various raster formats.

The use of programming to create the video patterns shown in FIG. 1 allows the patterns' attributes to be more readily changed as necessary for a particular test. Programmability facilitates the use of the selected display on different scan formats while maintaining one-pixel resolution. For example, the vertical lines of the pattern shown in FIGS. 1j or 1k may be displayed as one-pixel wide. The program is able to adapt to the different scan rates, inter alia, by virtue of the outputs from the pixel frequency generator 42 and the dependent reference frequency generator 43 being used to time the program's output.

Referring to FIG. 1, programmability offers flexibility as follows:

| FEATURES PROGRAMMABLE | TEST PATTERN |
| --- | --- |
| programmable position | a–c, h, i |
| programmable quantity or size | a–c, e, f, h–l |
| programmable color and intensity | b, d–h, j–l |
| programmable color intensity for each element | a, c, i |
| programmable content | c, i |

Figure 6:
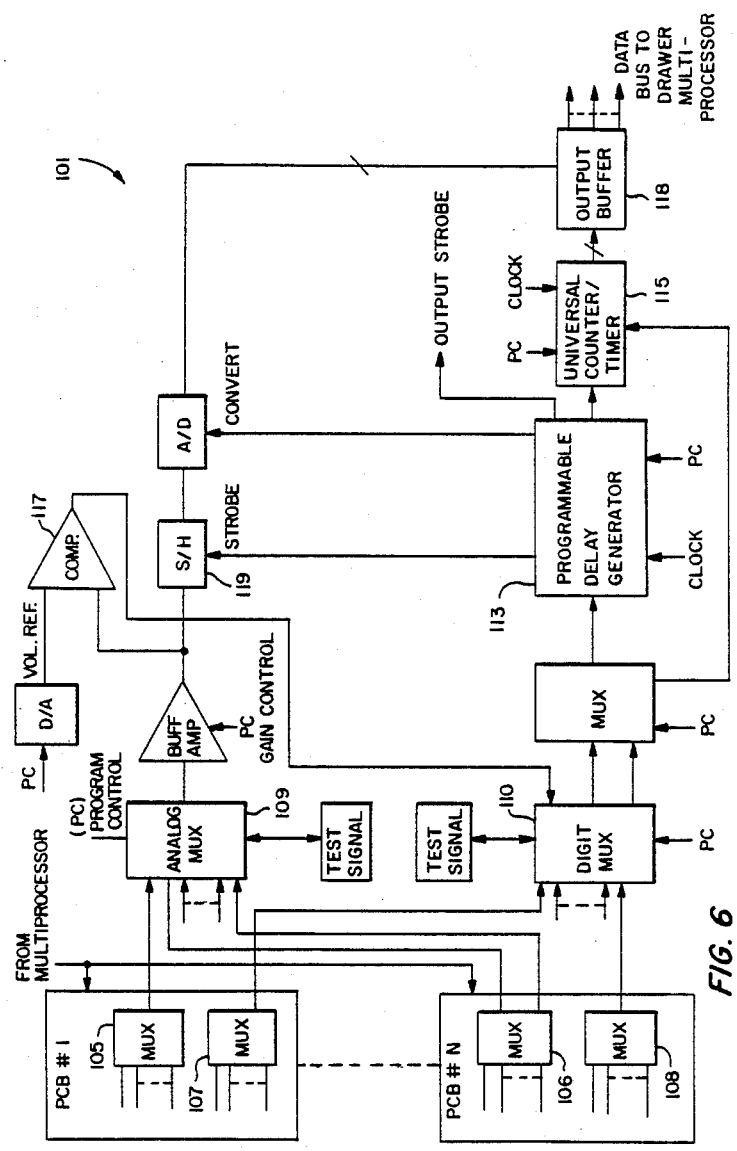
FIG. 6 is a block diagram showing the use of built in test equipment to give the system a self-test capability.

While the preferred embodiment, as so far described, is directed to a system for testing video apparatus, the system is also capable of self-testing. This is particularly significant since the system has as its function stimulation of a unit under test to produce errors and/or glitches whose source is not always known. For this reason, built in test equipment (B.I.T.E.) is incorporated into the circuitry. Referring to FIG. 2, a B.I.T.E. module 101 is connected to the multiprocessor. Referring to FIG. 6, each of N printed circuit boards in the system provides analog and digital information concerning the system outputs at various test points. These test points are located throughout the system's software, as exemplified by digital and analog test points $TP_1$ through $TP_5$ and $TP_1'$ through $TP_4'$, as shown in FIG. 3. Signals from the test points on each card are channeled through test point multiplexers, such as multiplexer 103 shown in FIG. 3 or multiplexers 105–108 shown in FIG. 6.

Referring to FIG. 6, a pair of printed circuit boards are shown having analog multiplexers 105 and 106 and separate digital multiplexers 107 and 108. Because of the different functions on each card and the different test readings, each multiplexer need not be the same. For example, analog multiplexer 105 has a single output, whereas analog multiplexer 106 has two outputs. The various outputs are, in turn, controlled by input multiplexers 109 and 110, with input multiplexer 109 being an analog multiplexer and input multiplexer 110 being a digital multiplexer. The digital multiplexer signal is then processed by a programmable delay generator 113 and a counter timer 115 which is used to process the digital signals to obtain measurements of frequency, time interval, pulse width and time delay. A comparator 117 derives digital signals from analog signals from the analog multiplexer 107 and provides the digital comparison value to the digital input multiplexer 110. The outputs of the counter/timer 115 and time-selected values from the analog input multiplexer 109 are provided to an output data bus via an output buffer 118.

A sample and hold circuit 119 is used to sample signals from the analog multiplexer 109 in response to an internal strobe signal from the programmable delay generator 113. The sampled value, after being converted to digital form, is provided to the output data bus via the output buffer 118. The use of the internal strobe signal from the programmable delay generator 113 allows the sampling of an analog value at a predetermined point in time.

An external strobe is used to provide signals to circuits outside of the B.I.T.E. module 101 so that various signals throughout the system can be sampled at appropriate times by programming the programmable delay generator 113.

The multiprocessor 11 is able to obtain readings from the various test points from various functions performed by the equipment. The programmable delay generator 113 enables these readings be analyzed with respect to frequency, time interval, pulse width and time delay in order to determine whether an error appearing in a test is a result of the equipment being tested or the test equipment itself.

It is anticipated that numerous changes will be made to the preferred embodiment of the invention. For example, an ability to change scanning frequency and frame rates can be enhanced or deleted. It is anticipated that the specific features and the specific hardware required for producing these features can and will be changed in accordance with the economics of production and the individual whims of the engineers reducing the invention to practice. Accordingly, it is urged that the invention be read only as limited by the claims.

What is claimed is:

1. Apparatus for testing circuits within a system, comprising:
   (a) means for sampling and holding signals generated by the circuits within the system;
   (b) means for generating signals corresponding to frequency and timing of outputs provided by selected circuits within the system, said signals corresponding to conditions of the selected circuits;
   (c) and the delay means connected to the frequency and timing means and to the sampling and holding means, the delay means and responsive to the signals from the frequency and timing means for generating an output strobe after an appropriate time, the output strobe initiating the sampling and holding of the signals provided by the selected circuits the appropriate time being selectable; and
   (d) output means connected to the frequency and timing means for generating signals indicative of circuit conditions at the time of the sampling and holding.

2. Apparatus as described by claim 1 further comprising the circuits within the system including registers which store data indicative of the outputs of said circuits upon receiving the output strobe.

3. Apparatus as described by claim 2, further comprising means for transmitting the data in the registers for analysis by the system.

4. In a system having a plurality of test points, apparatus for testing the system, comprising:
   (a) a plurality of multiplexers, each of which is connected to at least one of the plurality of test points for selecting signals therefrom and for generating corresponding multiplexer analog and digital signals;
   (b) a first multiplexer connected to the plurality of multiplexers and responsive to the analog signals therefrom the generating analog outputs;
   (c) a second multiplexer connected to the plurality of multiplexers and responsive to the digital signals therefrom for generating digital outputs;
   (d) a delay generator connected to the second multiplexer and responsive to the digital outputs for generating first and second delay signals after an appropriate time, the appropriate time being selectable;
   (e) means for generating a reference signal;
   (f) a comparator connected to the first multiplexer and to the reference signal means for comparing the analog outputs and the reference signal and for generating a digital comparison signal;
   (g) the comparator connected to the second multiplexer for applying the digital comparison signal to said second multiplexer so that the digital output from the second multiplexer is combined with the digital signals;
   (h) an output means;
   (i) a converter connected to the first multiplexer for converting the analog outputs to digital signals;
   (j) means connected to the delay generator and to the converter for receiving the first delay signal and for applying the digital signal from the converter to the output means upon receipt of the first delay signal; and
   (k) means for generating a signal containing information concerning the second time delay and transmitting said signal to the output means, whereby the output means generates data indicative of circuit conditions in the system.

5. Apparatus as claimed in claim 4, further comprising an output strobe signal transmitted from the delay generator, the output strobe signal initiating a sampling of data from selected circuits within the system.

6. In a system for testing equipment by using means to generate programs for a plurality of time-dependent functions, apparatus for testing circuits within the system comprising:
   (a) a plurality of test point multiplexers within the system, each multiplexer selecting data from at least one of a plurality of test points, the test point multiplexers providing test point multiplexer outputs;
   (b) a first multiplexer receiving analog signals from a plurality of the test points multiplexers and generating an analog output;
   (c) output means;
   (d) means connected to the first multiplexer, said means converting the analog output to corresponding digital output data, the converting means providing said digital output data to the output means;
   (e) a digital multiplexer receiving digital signals from a plurality of the test point multiplexers and generating a digital output;
   (f) a delay generator connected to the digital multiplexer and generating first and second time delay signals in response to said digital outputs after an appropriate time, the appropriate time being selectable;
   (g) means to activate the means to convert the analog signal so as to transmit said corresponding digital data to the output means in response to the first time delay signal; and
   (h) means to transmit information concerning the second time delay signal to said output means, the information being an indication of a relationship of at least one of the time-dependent functions.

7. Apparatus as claimed in claim 6, further comprising an output strobe transmitted from the delay generator, the output strobe signal initiating a sampling of data from selected circuits within the system.

8. Apparatus as claimed in claim 6 or 7, further comprising:
   (a) the equipment including a cathode ray tube and
   (b) the time-dependent functions including functions for scanning the cathode ray tube.

9. Apparatus as claimed in claim 4, 5 or 6 further comprising the delay generator being programmable.

10. A method for self-testing circuits within a system comprising:
    (a) sampling a waveform provided by a plurality of circuits within the system in order to obtain a sample and hold capability;
    (b) setting gating for frequency and timing measurements of outputs of selected circuits within the system;

(c) selecting an appropriate time for generating an output strobe; and (d) output strobe at said appropriate time to initiate sampling and holding of data provided by the selected circuits within the system.

11. In a system including self-test apparatus, a method for testing circuits within the system comprising:
  (a) selecting input data in analog and digital form from a plurality of test points on a plurality of the circuits;
  (b) receiving the analog input data from a plurality of the test points and generating analog output signals;
  (c) converting the analog output signals to digital data corresponding to the analog output signals, and transmitting the digital data to an output means;
  (d) receiving the digital input data from a plurality of the test points and generating corresponding digital output signals;
  (e) generating first and second time delay signals in response to said digital output signals;
  (f) generating a reference signal, comparing the analog output signals to the reference signal and generating comparison signals to be received with said digital input data from the plurality of test points;
  (g) activating the conversion of the analog signal to the digital data in response to the first time delay signals; and
  (h) transmitting information concerning the second time delay signals to the output means.

12. Method as claimed in claim 11, further comprising selecting a delay time and generating third delay signals as an output strobe signal after said time delay, transmitting an output strobe signal and initiates a sampling and holding of the input data upon the transmission of the output strobe signal.

13. Method as claimed in claim 12, further comprising using a programmable delay generator to select the time delays.

14. In a system for testing equipment having a plurality of time-dependent functions, a method for testing circuits within the system comprising:
  (a) selecting input data in analog and digital form from a plurality of test points on a plurality of the circuits;
  (b) receiving the analog input data from a plurality of the test points and generating a corresponding analog output signal;
  (c) converting the analog output signal to digital data corresponding to the analog output and transmitting the data to an output means;
  (d) receiving the digital input data from a plurality of the test points and generating a digital output signal;
  (e) selecting an appropriate time and generating first and second time delay signals in response to said digital output, delay by said appropriate time;
  (f) generating a comparison signal, comparing the analog output signal to comparison signal and comparison transmitting said signals to be received with said digital signals from the plurality of test points; and
  (g) activating the conversion of the analog output to the corresponding digital data in response to the first time delay signal; and
  (h) transmitting information concerning the second time delay signals, thereby providing an indication of a relationship of at least one of the time-dependent functions.

15. Method as claimed in claim 14, further comprising generating a third delay and transmitting an output strobe signal to initiate a sampling and holding of data in response to the transmission of the output strobe signal.

16. Method as claimed in claim 14 or 15, further comprising the equipment including a cathode ray tube and the time-dependent functions include functions for scanning the cathode ray tube.

17. Method as claimed in claim 14 or 15, further comprising at least one of the time delay signals being programmable.

18. Apparatus as described in claim 1, further comprising:
  the delay means including an output which transmits signals to circuits outside of said apparatus so that various signals throughout said system can be sampled at said appropriate time.

* * * * *